United States Patent
Boggs et al.

(10) Patent No.: US 6,695,634 B1
(45) Date of Patent: Feb. 24, 2004

(54) METHOD AND SYSTEM FOR COUPLING CIRCUIT BOARDS IN A PARALLEL CONFIGURATION

(75) Inventors: Joshua M. Boggs, Round Rock, TX (US); Joel J. Jaramillo, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/339,430

(22) Filed: Jan. 9, 2003

(51) Int. Cl.⁷ .............................................. H01R 13/62
(52) U.S. Cl. ........................................ 439/329; 439/74
(58) Field of Search ...................... 439/329, 65, 66, 439/67, 74, 75, 91, 73; 361/790, 803, 804, 802, 785, 787, 788

(56) References Cited

U.S. PATENT DOCUMENTS

| | | | | |
|---|---|---|---|---|
| 3,459,998 A | * | 8/1969 | Focarile ....................... 361/690 |
| 4,939,624 A | * | 7/1990 | August et al. ................ 361/816 |
| 5,013,249 A | * | 5/1991 | Lindeman et al. ............ 439/66 |
| 5,224,918 A | * | 7/1993 | Neumann et al. ............. 29/885 |
| 5,334,029 A | * | 8/1994 | Akkapeddi et al. ........... 439/66 |
| 5,536,177 A | * | 7/1996 | Casey .......................... 439/74 |
| 5,575,686 A | * | 11/1996 | Noschese .................... 439/620 |
| 5,634,819 A | | 6/1997 | Pan et al. .................... 439/637 |
| 6,038,138 A | | 3/2000 | Dayton et al. .............. 361/796 |
| 6,109,930 A | * | 8/2000 | Koschmeder et al. ......... 439/74 |
| 6,305,982 B1 | | 10/2001 | Wu ............................. 439/607 |

* cited by examiner

Primary Examiner—Ross Gushi
(74) Attorney, Agent, or Firm—Hamilton & Terrile, LLP; Robert W. Holland

(57) ABSTRACT

A method and system couples first and second circuit boards, such as a daughterboard coupled to a motherboard, in a parallel configuration by aligning connectors disposed on each circuit board's surface, inserting a retention post from the first circuit board through an opening in the second circuit board, and compressing the circuit boards together with a retaining member that couples at adjustable points of the retention post and presses against the second circuit board at the connectors. For instance a bow spring accepts a threaded retention post and has arms extending from a raised portion so that the arms align with the connectors. A compressing force applied to the bow spring by a thumbscrew tightened on the threads is spread substantially evenly to each connector so that the connectors insert into each other along the retention post axis.

20 Claims, 3 Drawing Sheets

METHOD AND SYSTEM FOR COUPLING CIRCUIT BOARDS IN A PARALLEL CONFIGURATION

BACKGROUND OF THE INVENTION

1. Field of the Invention

The present invention relates in general to the field of interfacing circuit boards, and more particularly to a method and system for coupling information handling system circuit boards in a parallel configuration.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

One common goal of information handling system manufacturers is to efficiently configure electronic components to include as much functionality as possible in as little room as practical. To aid in the efficient use of space, low profile board-to-board connectors are sometimes used for a high density component configuration solution in which circuit boards are connected together with their surfaces aligned parallel to each other. For instance, a daughterboard couples to connectors disposed on a motherboard surface so that the daughterboard and motherboard surfaces are in parallel alignment with a standoff height board-to-board distance of 4 mm or less. One difficulty with such configurations is that the small amount of space between the circuit cards leaves little room for attachment or support mechanisms to retain the circuit boards in position relative to each other. Another difficulty is that the relatively small clearances between the circuit boards makes visual alignment of connectors difficult with little pin lead-in between connectors, sometimes resulting in bent pins where the circuit boards are not accurately guided into each other. Although one option is to enlarge the room between the circuit boards, increasing this spacing increases the vertical footprint of the information handling system.

A number of connectors exist to connect circuit boards in a parallel alignment. Frictional connectors align the cards and manually mate with each other so that the mating force of the connectors couples the boards together. However, these connectors are often not sufficiently secure and allow excessive fluctuations in standoff height, possibly resulting in poor electrical communications between the boards. Snap standoff posts snap into both boards with a post typically equal in length to the board-to-board dimension and generally are used only for permanent board connections. Similarly, board edge levers apply force on a portion of the board, typically along the edge, with a lever or secondary part that allows removal of the board but is awkward to manipulate. Another option is to dispose standoff pieces between the circuit boards and then couple the boards together with screws so that the standoff pieces maintain spacing between the circuit boards. However, these standoff pieces increase the complexity of manufacturing the circuit boards and are difficult to use in a manner that maintains both a desired standoff height and a sound electrical connection between the circuit boards.

SUMMARY OF THE INVENTION

Therefore a need has arisen for a method and system which quickly and securely couples circuit boards in a parallel configuration with a low profile.

A further need exists for a method and system which maintains a sound electrical connection between the connectors of circuit boards having a parallel configuration.

A further need exists for a method and system that aligns connectors of the circuit boards having a parallel configuration when the physical view of the connectors is blocked during mating of the connectors.

A further need exists for a method and system which couples circuit boards in a parallel configuration by mating multiple separate electrical connectors between the circuit boards.

In accordance with the present invention, a method and system are provided which substantially reduce the disadvantages and problems associated with previous methods and systems for coupling circuit boards together in a parallel configuration. A retention post and retaining member assembly aligns and mates connectors of the circuit boards and transfers mating force over the connectors to couple connectors together and retain the circuit boards in a parallel configuration.

More specifically, a retention post extends perpendicular from the surface of a motherboard. Connector sockets are disposed in the motherboard surface proximate to the retention post. A daughterboard aligns with the motherboard by aligning an opening of the daughterboard with the retention post and inserting the retention post through the opening. Connectors are disposed in the daughterboard surface proximate the opening so that insertion of the retention post into the opening guides the connectors into the connector sockets. A bow spring retaining member has flexible arms that extend from a raised central portion so that the retention post inserts into an opening of the bow spring central portion to align the arms with the connectors. A fastener, such as a captive screw or thumbscrew, tightens to selectable positions of the retention post to mate the connectors and to exert a retaining force that maintains the daughterboard in a parallel configuration relative to the motherboard. The flexible arms act as a spring to take up excess tightening torque applied to the connectors by the tightening of the thumbscrew fastener. The bow spring retaining member raises the thumbscrew fastener to a height just below the vertical footprint of an information handling system so that it is easily accessed without increasing the profile of the parallel configuration of the circuit boards.

The present invention provides a number of important technical advantages. One example of an important technical advantage is that circuit boards are quickly and securely coupled together in a parallel configuration with a low profile. The raised portion of the bow spring provides a solid area to apply mating force when initially engaging a daughterboard to reduce the risk that an assembler will push on the circuit boards or components during installation. The bow spring provides reliable mating of connectors by creating a direct preload on each connector. Further, the thumbscrew fastener is elevated from the daughterboard surface to provide ease of access for tightening and removal of the daughterboard.

Another example of an important technical advantage of the present invention is that a sound electrical connection is maintained between the connectors of circuit boards having a parallel configuration. Using multiple connectors allows the flexible bow spring to distribute the retention force substantially evenly directly to each connector to ensure a solid electrical connection even should the circuit cards have some vertical standoff fluctuations. The retention force is thus evenly applied for all connector pins regardless of the distance between the retention post and a given connector pin. The bow spring also flexes to avoid the application of excessive retention force that could damage the daughterboard.

Another example of an important technical advantage of the present invention is that connectors of circuit boards having a parallel configuration are effectively aligned although the parallel configuration blocks the physical view during mating of the connectors. The retention post aligns the daughterboard by inserting in an appropriately placed opening of the daughterboard. This alignment aids in proper mating of connectors that are hidden from view as the daughterboard is placed over the motherboard for assembly. Proper alignment reduces the risk of bent pins in low profile applications.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Low profile parallel daughterboard-to-motherboard configurations provide increased density for more compact information handling systems, but leave little room for effective attachment with adequate retention force. The present invention aligns and couples circuit boards, such as a daughterboard to a motherboard, with a bow spring retaining member and retention post system that distributes the retention force evenly across connectors within the restricted space available in an information handling system. For purposes of this application, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
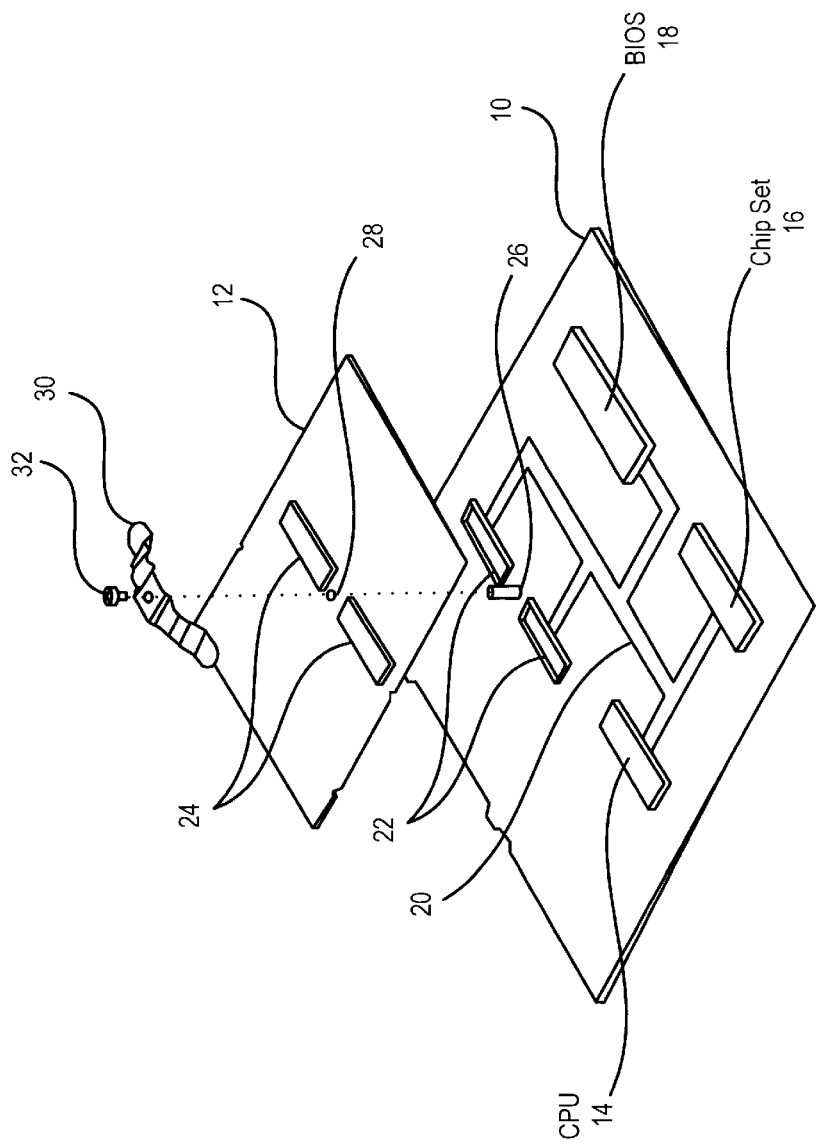
FIG. 1 depicts a perspective view of an information handling system motherboard arranged to accept a daughterboard in a parallel configuration.

Referring now to FIG. 1, a perspective view of an information handling system motherboard 10 arranged to accept a daughterboard 12 in a parallel configuration is depicted. The surface of motherboard 10 supports and interfaces a variety of information handling system components, such as a CPU 14, chipset 16 and BIOS 18 that communicate over one or more buses 20. The surface of motherboard 10 has two connector sockets 22 aligned and spaced to accept connectors 24 disposed on the surface of daughterboard 12. Connector sockets 22 and connectors 24 communicate information between motherboard 10 and daughterboard 12 and act as contact points to hold motherboard 10 and daughterboard 12 in spaced parallel alignment.

In order to secure daughterboard 12 to motherboard 10 with the desired alignment, a retention post 26 extends perpendicular from the surface of motherboard 10 to insert through an opening 28 in daughterboard 12. Retention post 26 and opening 28 are spaced relative to connectors 22 and 24 respectively so that insertion of retention post 26 into opening 28 provides guidance for alignment of daughterboard 12 and motherboard 10 to insert connectors 24 into connector sockets 22. A bow spring retaining member 30 inserts over retaining post 26 to align each arm with a connector 24. Bow spring retaining member 30 is secured to retention post 26 by a thumbscrew fastener 32 that screws into threads fabricated in or on retention post 26. Tightening of thumbscrew fastener 32 on retention post 26 asserts a compressing force on connectors 24 to engage with connector sockets 22 with the mating force transferred by flexing of bow spring retaining member 30 to be exerted substantially evenly directly over each connector 24. Once connectors 24 are securely engaged in connector sockets 22, the flexing of bow spring retaining member 30 absorbs excess torque to reduce the risk of damage or warping of daughterboard 12 or motherboard 10. The use of a thumbscrew allows ease of assembly, although other fasteners may be used, such as other types of captive screws that allow selective tightening against bow spring retaining member 30.

Figure 2:
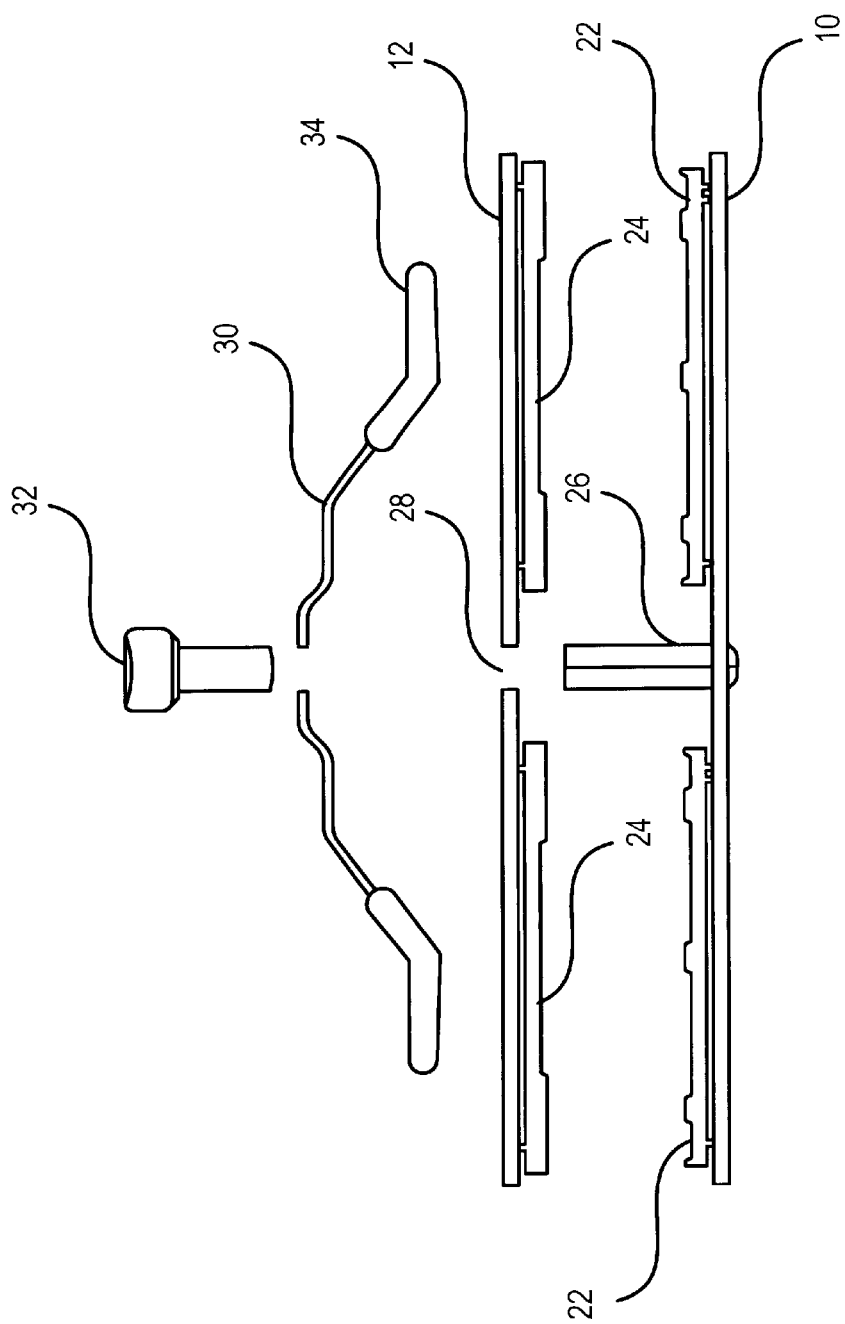
FIG. 2 depicts a side view of a daughterboard aligned for assembly to a motherboard with a bow spring retaining member.

Referring now to FIG. 2, a side view of daughterboard 12 aligned for assembly to motherboard 10 with a bow spring retaining member 30 is depicted. Bow spring retaining member 30 accepts thumbscrew fastener 32 at a position elevated from the surface of daughterboard 12 and provides a compressing force through downward projecting arms that contact daughterboard 12 over top of connectors 24. A plastic insulating material 34 is inserted over the ends of the arms of bow spring retaining member 30 to protect the surface of daughterboard 12 from damage or electrical interference. The insertion of retention post 26 into opening 28 guides correct engagement of connectors 24 into connector sockets 22 that are otherwise difficult to visually align. As thumbscrew fastener 32 is tightened down retention post 26, a mating force of approximately 10 to 20 pounds per connector is applied directly to each connector and connector socket along the axis of retention post 26 so that the connectors and connector sockets fully engage with reduced risk of damaged connector pins due to off-axis engagement of the pins and socket connections, such as occurs with a levered connection motion. Bow spring retaining member 30 also provides a solid raised area relative to daughterboard 12 to assert a force by an assembly technician on the connectors 22 and 24 without direct contact to daughterboard 12 or its components that could result in damage to electronic components.

Figure 3:
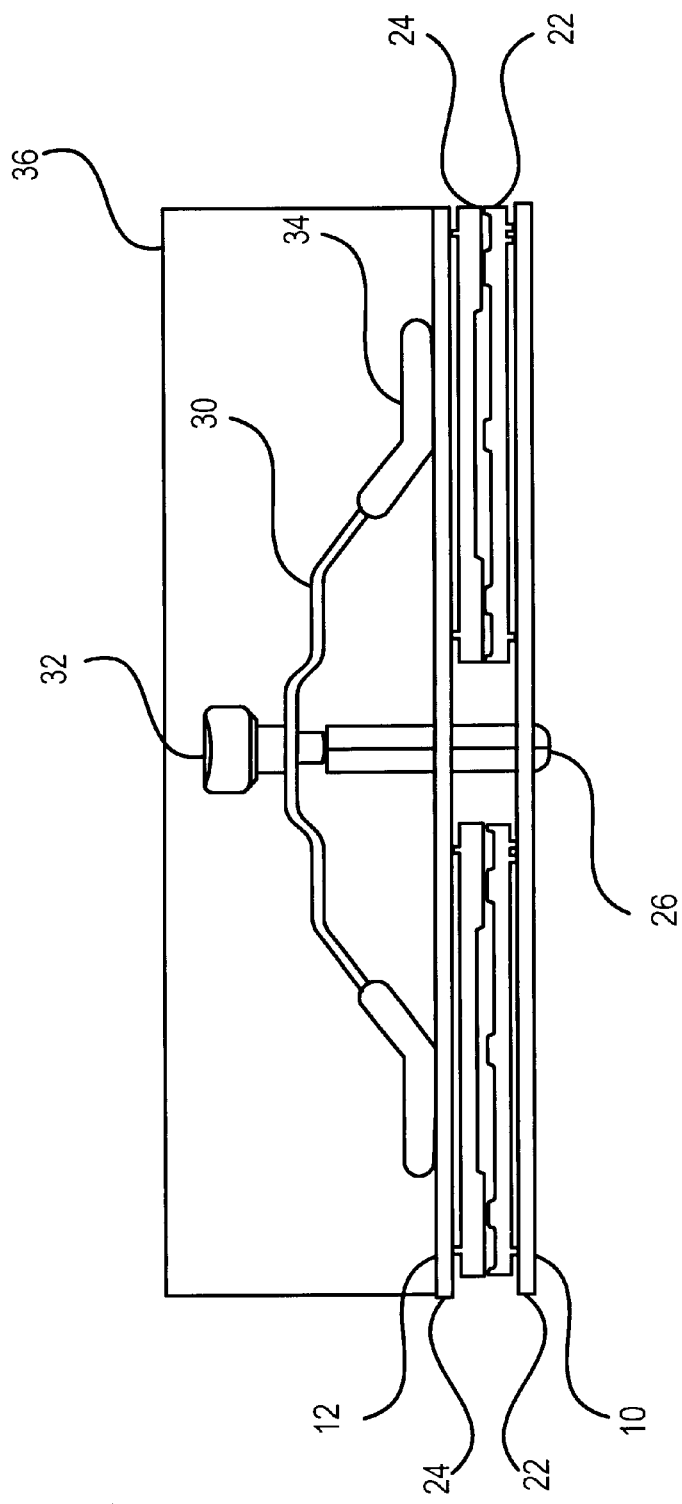
FIG. 3 depicts a side view of a daughterboard coupled with a motherboard by a bow spring retaining member.

Referring now to FIG. 3, a side view of daughterboard 12 coupled with motherboard 10 by bow spring retaining member 30 is depicted. Board-to-board connectors 22 and 24 provide a low profile, for instance having a separation of approximately 4 mm between daughterboard 12 and motherboard 10. Bow spring retaining member 30 may vary in its raised height over daughterboard 12 to allow ease of access to thumbscrew fastener 32 yet not exceed the height of components mounted to daughterboard 12. For instance, a memory module 36 mounts to the surface of daughterboard 12 so that bow spring retaining member 30 has a height slightly less than the height of memory module 36. In this manner, thumbscrew fastener 32 remains accessible for tightening or loosening daughterboard 12 yet does not increase the overall height footprint of the information handling system. The distributed mating force exerted by the arms of bow spring retaining member 30 reduces fluctuations in the standoff height between daughterboard 12 and motherboard 10 to ensure a consistent electrical connection between connectors 22 and 24. In alternative embodiments, additional contact points may be incorporated in daughterboard 12, whether or not associated with an electrical connection, to accept a wider distribution of compression force with additional retaining member arms.

Although the present invention has been described in detail, it should be understood that various changes, substitutions and alterations can be made hereto without departing from the spirit and scope of the invention as defined by the appended claims.

What is claimed is:

1. An information handling system comprising:
    a motherboard having a surface operable to interface with electronic components that process information;
    a retention post extending substantially perpendicular from the motherboard surface;
    plural connector sockets disposed on the motherboard surface proximate the retention post;
    a daughterboard disposed parallel to the motherboard surface, the daughterboard having an opening that accepts the retention post;
    plural connectors disposed on the daughterboard surface, each connector aligned and connected with an associated connector socket of the motherboard; and
    a retaining member coupled to the retaining post, the retaining member having plural arms, each arm aligned with a connector to force the connector into the associated connector socket.

2. The information handling system of claim 1 wherein the retaining member comprises a flexible material that distributes the force substantially evenly to each connector.

3. The information handling system of claim 2 wherein the retaining member comprises a bow spring having plural arms, each bow spring arm extending from an associated connector of the daughterboard to an elevated coupling point.

4. The information handling system of claim 3 further comprising an insulating material disposed between each bow spring arm and its associated connector.

5. The information handling system of claim 4 wherein the insulating material comprises a plastic foot slipped over each bow spring arm.

6. The information handling system of claim 3 wherein the retention post comprises a threaded surface and the coupling point comprises an opening in the bow spring that accepts the retention post.

7. The information handling system of claim 6 further comprising a thumbscrew coupled to the retention post threads to force the bow spring towards the daughterboard.

8. A method for coupling first and second circuit boards together in a parallel alignment, the method comprising:
    aligning the circuit board surfaces parallel with each other;
    aligning connectors of the circuit boards;
    aligning a retention post coupled to the first circuit board with an opening in the second circuit board;
    aligning a retaining member with the retention post;
    aligning arms of the retaining member with the connectors of the second circuit board; and
    securing the retention post to the retaining member to engage the connectors together.

9. The method of claim 8 wherein aligning the retaining member and the retention post further comprises inserting the retention post into an opening of the retaining member.

10. The method of claim 8 wherein the retaining member comprises a bow spring and securing further comprises:
    protecting the circuit boards from over tightening by absorbing excess tightening force through flexing of the bow spring.

11. The method of claim 10 further comprising:
    protecting the second circuit board from the bow spring arms with an insulating material inserted between the arms and the connectors.

12. The method of claim 9 wherein securing the retention post further comprises:
    coupling a thumbscrew to the retention post over the retaining member; and
    tightening the thumbscrew to press each connector of the second circuit board into a connector of the first circuit board substantially evenly.

13. The method of claim 12 wherein the retaining member comprises a bow spring having an arm aligned with each connector of the second circuit board.

14. The method of claim 13 wherein the first circuit board comprises a motherboard and the second circuit board comprises a daughterboard.

15. The method of claim 14 further comprising coupling memory to the daughterboard.

16. The method of claim 12 further comprising:
    untightening the thumbscrew;
    removing the retaining member; and
    removing the second circuit board from the first circuit board.

17. A system for coupling circuit boards with their surfaces in a parallel configuration, the system comprising:
    first and second circuit boards each having plural contact points, the second circuit board having an opening proximate the contact points;

a retention post extending perpendicular from the surface of the first circuit board proximate the contact points;

a bow spring having flexible arms extending from a raised portion, the raised portion having an opening; and a fastener operable to secure to selectable positions of the retention post;

wherein the first and second circuit boards couple in a parallel configuration with the contact points aligned, the retention post inserted through the second circuit board and the bow spring opening, each bow spring arm aligned over a contact point of the second circuit board, the fastener coupled to a selectable position on the retention post that securely engages the contact points of the first and second circuit boards together.

18. The system of claim 17 further comprising an insulating element inserted between each bow spring arm and second circuit board contact point.

19. The system of claim 17 wherein each contact point comprises an electrical connection operable to communicate information between the circuit boards.

20. The system of claim 17 wherein the retention post comprises a threaded post and the fastener comprises a thumbscrew operable to screw down the retention post threads against the bow spring raised surface to provide a substantially even compression force at each connection point.

* * * * *